United States Patent
Mandokoro et al.

(10) Patent No.: US 8,941,003 B2
(45) Date of Patent: Jan. 27, 2015

(54) POLYESTER FILM WITH UV-STABILITY AND HIGH LIGHT TRANSMITTANCE

(75) Inventors: Nori Mandokoro, Midlothian, VA (US); Simon Shepherd, Moseley, VA (US)

(73) Assignee: Dupont Teijin Films U.S. Limited Partnership, Chester, VA (US)

( * ) Notice: Subject to any disclaimer, the term of this patent is extended or adjusted under 35 U.S.C. 154(b) by 155 days.

(21) Appl. No.: 13/577,152

(22) PCT Filed: Feb. 4, 2011

(86) PCT No.: PCT/IB2011/000415
§ 371 (c)(1),
(2), (4) Date: Sep. 11, 2013

(87) PCT Pub. No.: WO2011/117694
PCT Pub. Date: Sep. 29, 2011

(65) Prior Publication Data
US 2014/0000706 A1 Jan. 2, 2014

(30) Foreign Application Priority Data
Feb. 5, 2010 (GB) .................................. 1001947.9

(51) Int. Cl.
*H01L 31/0216* (2014.01)
*H01L 31/048* (2014.01)
*C08J 7/04* (2006.01)

(52) U.S. Cl.
CPC ........... *H01L 31/02161* (2013.01); *C08J 7/047* (2013.01); *H01L 31/0481* (2013.01); *C08J 2367/02* (2013.01); *C08J 2423/00* (2013.01); *C08J 2433/00* (2013.01); *Y02E 10/50* (2013.01)
USPC ........ 136/256; 136/259; 428/336; 427/372.2; 427/171

(58) Field of Classification Search
CPC ...................... H01L 31/0216; H01L 31/02161; H01L 31/0481; C08J 7/047; C08J 2367/02; C08J 2423/00; Y02E 10/50
USPC ......... 136/205, 206, 224, 244, 245, 252, 256, 136/258; 428/143, 483, 910, 336; 427/180, 427/372.2, 171
See application file for complete search history.

(56) References Cited

U.S. PATENT DOCUMENTS

| | | |
|---|---|---|
| 3,244,708 A | 4/1966 | Duennenberger et al. |
| 3,843,371 A | 10/1974 | Bernhard Piller |
| 4,446,262 A | 5/1984 | Okumura et al. |
| 4,619,956 A | 10/1986 | Susi |
| 4,681,905 A | 7/1987 | Kubota et al. |
| 4,684,679 A | 8/1987 | Kubota et al. |
| 4,767,659 A | 8/1988 | Bailey et al. |
| 4,812,498 A | 3/1989 | Nakahara et al. |
| 5,078,803 A | 1/1992 | Pier et al. |
| 5,251,064 A | 10/1993 | Tennant et al. |
| 5,264,539 A | 11/1993 | Shepherd |
| 5,288,778 A | 2/1994 | Schmitter et al. |
| 6,004,422 A * | 12/1999 | Janovec et al. ................ 156/276 |
| 6,114,021 A | 9/2000 | Pankratz |
| 2002/0028862 A1* | 3/2002 | Johnson et al. ................ 524/100 |
| 2003/0076596 A1* | 4/2003 | Miyatake et al. .............. 359/601 |
| 2004/0247916 A1* | 12/2004 | MacDonald et al. .......... 428/523 |
| 2006/0127463 A1 | 6/2006 | Nugara |
| 2006/0169971 A1 | 8/2006 | Cho et al. |
| 2007/0092695 A1 | 4/2007 | Jesberger et al. |

FOREIGN PATENT DOCUMENTS

| | | |
|---|---|---|
| EP | 0 006 686 A2 | 1/1980 |
| EP | 0 031 202 A2 | 7/1981 |
| EP | 0 031 203 A2 | 7/1981 |
| EP | 0 076 582 A1 | 4/1983 |
| EP | 0 399 815 A2 | 5/1990 |
| EP | 0 504 808 A1 | 9/1992 |
| EP | 0 592 284 A2 | 4/1994 |
| GB | 2 359 275 A | 8/2001 |
| JP | 10114872 A | 5/1998 |
| JP | 2003-182013 A | 7/2003 |
| JP | 2008524022 A | 7/2008 |
| WO | WO 94/05645 | 3/1994 |
| WO | WO 99/24256 | 5/1999 |
| WO | WO 00/66675 | 11/2000 |
| WO | WO 2007/079246 A2 | 7/2007 |
| WO | WO/2009/127842 | 10/2009 |

OTHER PUBLICATIONS

Hillebrand, Gerhard, International Search Report and Written Opinion dated Aug. 19, 2011, for International Application No. PCT/IB2011/000415, 9 pgs.

* cited by examiner

Primary Examiner — Susan D Leong
(74) Attorney, Agent, or Firm — RatnerPrestia

(57) ABSTRACT

A composite film comprising: (i) a heat-stabilised oriented polyester substrate comprising a UV-absorber in an amount of from about 0.1 to about 10% based on the total weight of the polyester substrate, and (ii) on one or both surfaces of the substrate a polymeric coating layer, which has a thickness in the range of from about 10 nm to about 200 nm, and which comprises an ethylene acrylic acid (EAA) copolymer, wherein the composite film exhibits a shrinkage at 150° C. for 30 minutes of less than 0.1% in both the longitudinal and transverse dimensions of the film, and use thereof in the manufacture of photo-voltaic cells.

21 Claims, No Drawings

POLYESTER FILM WITH UV-STABILITY AND HIGH LIGHT TRANSMITTANCE

CROSS REFERENCE TO RELATED APPLICATIONS

This application is the national stage filing of PCT application number IB2011/000415, filed 4 Feb. 2011, and claims priority of British patent application number 1001947.9, filed 5 Feb. 2010, the entireties of which applications are incorporated herein by reference.

FIELD OF THE INVENTION

The present invention is concerned with a polyester film which exhibits high UV-stability and high light transmittance, and which is of particular use in the manufacture of photovoltaic (PV) cells and other electronic devices, particularly flexible devices.

BACKGROUND OF THE INVENTION

The mechanical properties, dimensional stability, flexibility, weight, impact resistance and optical properties of polyester films offer advantages for their use in the manufacture of electronic or opto-electronic devices, such as electroluminescent (EL) display devices (particularly organic light emitting display (OLED) devices), electrophoretic displays (e-paper), photovoltaic (PV) cells and semiconductor devices (such as organic field effect transistors, thin film transistors and integrated circuits generally). The use of flexible polyester film as layer(s) in electronic devices allows the manufacture of such devices in a reel-to-reel process, thereby reducing cost.

A photovoltaic cell generally comprises a front-plane (or front-sheet); a front-side encapsulant material; the photoactive material on an electrode support substrate; a rear-side encapsulant; a rear back-plane (or back-sheet); and various components to collect and manage the electrical charge. Polyester films have been proposed in the manufacture of various layers in PV cells, for instance the front-plane, the back-plane, the electrode support layer(s). Photovoltaic modules, often consisting of many photovoltaic cells, are usually categorized according to the active photovoltaic materials used. These include crystalline silicon, gallium-arsenide (GaAs), amorphous silicon (a-Si), cadmium-telluride (CdTe), copper-indium-gallium-(di)selenide (CIGS), dye-sensitized or organic cells. Photovoltaic cells containing gallium-arsenide, amorphous silicon, cadmium-telluride, copper-indium-gallium-(di)selenide, dye-sensitized or conductive organic material are often referred to as thin-film photovoltaic cells (TFPV cells), which may or may not be flexible. Other thin-film silicon PV cells include protocrystalline, nanocrystalline (nc-Si or nc-Si:H) and black silicon PV cells. Thin-film photovoltaic cells are made by depositing one or more thin layers of photovoltaic material on a substrate, the thickness range of a thin layer varying from 1 or 2 nanometers to tens of micrometer, using a variety of deposition methods and a variety of substrates.

One type of PV cell which has attracted much research and development is the CIGS (copper-indium-gallium-(di)selenide) PV cell. While the efficiency of current CIGS PV cells is lower than that of crystalline silicon PV cells, the CIGS PV cells offer cost-benefits as a result of cheaper materials and fabrication methods. The active CIGS thin-film layer may be deposited directly on a substrate, typically steel or molybdenum-coated glass, in a polycrystalline form and this is typically achieved by vacuum sputtering. Manufacturing processes have been reported which involve a continuous, roll-to-roll process to deposit all layers of the CIGS solar cell on a stainless steel substrate. Alternative processes include (i) deposition of nanoparticles of the precursor materials on the substrate followed by sintering in situ; and (ii) electroplating. A typical CIGS PV cell comprises a supporting substrate on which is disposed a thin crystalline layer of photo-active CIGS material and further comprising a transparent polymeric layer over the CIGS material which may function for example as a protective layer or as a charge-collection layer. This multilayer composite is then encapsulated with a barrier material, which holds the composite together and serves to evacuate the air in the structure and to provide high resistance to gas and solvent permeation. The encapsulating barrier material is typically utilised in the form of a self-supporting film or sheet, which is then applied to the multilayer composite using thermal lamination techniques, typically under vacuum, as is known in the art. The encapsulated composite is then sandwiched between a front-plane and a back-plane, such that the transparent polymeric layer is disposed between the photo-active layer and the front-plane. The front-plane and/or back-plane is/are typically glass but may also be a polymeric material.

Other types of thin-film PV cell, as mentioned hereinabove, are similarly manufactured with a material to encapsulate the various functional layers, including the photo-active layers, of the PV cell.

SUMMARY OF THE INVENTION

The present invention is particularly directed to a film suitable for use as a transparent layer in a PV cell, particularly a thin-film PV cell, and particularly the transparent polymeric layer in a CIGS PV cell as described above. Such a film should display one or more, and preferably all, the following combination of properties:

(i) High light transmission. Typically a total light transmission (TLT) of 85% over 400-800 nm is required for high PV cell efficiency. Typically, the layer should also exhibit a low haze of less than 0.7%, although a certain amount of haze can be beneficial (U.S. Pat. No. 5,078,803; Thin Solid Films 2007, 515, 8695) since it increases the path-length of light as it travels through the photo-active layer.

(ii) Good UV-stability. Lack of UV-stability can manifest itself in a yellowing, hazing and cracking of the film on exposure to sunlight thereby decreasing the effective service lifetime of the PV cell, and it is desired to improve UV-stability without detriment to the cost and efficiency of film manufacture, and without detriment to the light transmittance of the film.

(iii) Good adhesion to the encapsulant material. A problem with prior art devices has been the need for an additional surface treatment to improve adhesion between the protective layer and the encapsulant, and it would be desirable to dispense with any such step to increase manufacturing efficiency and reduce costs. In addition, it would be desirable to improve the adhesion between the encapsulant and protective layer, relative to the prior art devices.

(iv) Good thermal dimensional stability. This has typically been a significant problem for polymeric materials, which tend to exhibit poorer dimensional stability than optical-quality glass or quartz. In PV cells generally, poor dimensional stability of the polymeric layer, and particularly said transparent polymeric layer in CIGS PV cells, can result in the cracking of the overlying encapsulant barrier material, and particularly during the elevated temperatures (typically 130 to 160° C.; typically for up to 30 mins) and normally also low pressure experienced during manufacture of the device. For instance, prior art films have been observed to exhibit wrinkling and movement during the manufacture of a PV device.

It is an object of this invention to provide a polymeric film which exhibits the combination of high and preferably improved light transmission; good and preferably improved UV-stability; good and preferably improved adhesion to an encapsulant material; and good and preferably improved dimensional stability. It is a further object of this invention to provide a polymeric film which is suitable for use as a layer, particularly a transparent layer, in a PV cell (particularly a thin-film PV cell, particularly a CIGS PV cell, particularly one which is flexible). It is a further object of the invention to provide a polymeric film suitable for use as a layer disposed between the photoactive material and an encapsulant layer in a PV cell, particularly a CIGS PV cell, particularly wherein said layer is a protective layer or a charge-collection layer.

DETAILED DESCRIPTION OF THE INVENTION

According to the present invention, there is provided a composite film comprising:
(i) a heat-stabilised oriented polyester substrate comprising a UV-absorber in an amount of from about 0.1 to about 10% based on the total weight of the polyester substrate, and
(ii) on one or both surfaces of the substrate a polymeric coating layer, which has a thickness in the range of from about 10 nm to about 200 nm, and which comprises an ethylene acrylic acid (EAA) copolymer,
wherein the composite film exhibits a shrinkage at 150° C. for 30 minutes of less than 0.1% in both the longitudinal and transverse dimensions of the film.

The polyester substrate is a self-supporting film or sheet by which is meant a film or sheet capable of independent existence in the absence of a supporting base. The substrate is uniaxially or biaxially oriented, preferably biaxially oriented. The polyester(s) which constitute the substrate is/are typically synthetic linear polyester(s). Suitable polyesters are obtainable by condensing one or more dicarboxylic acid(s) or their lower alkyl (up to 6 carbon atoms) diesters with one or more diols. The dicarboxylic acid component typically contains at least one aromatic dicarboxylic acid, which is preferably terephthalic acid, isophthalic acid, phthalic acid, 1,4-, 2,5-, 2,6- or 2,7-naphthalenedicarboxylic acid, and is preferably terephthalic acid or 2,6-naphthalenedicarboxylic acid, and preferably terephthalic acid. The polyester may also contain one or more residues derived from other dicarboxylic acids such as 4,4'-diphenyldicarboxylic acid, hexahydroterephthalic acid, 1,10-decanedicarboxylic acid, and in particular aliphatic dicarboxylic acids including those of the general formula $C_nH_{2n}(COOH)_2$ wherein n is 2 to 8, such as succinic acid, glutaric acid sebacic acid, adipic acid, azelaic acid, suberic acid or pimelic acid, preferably sebacic acid, adipic acid and azelaic acid, and more preferably azelaic acid. The diol(s) is/are preferably selected from aliphatic and cycloaliphatic glycols, e.g. ethylene glycol, 1,3-propanediol, 1,4-butanediol, neopentyl glycol and 1,4-cyclohexanedimethanol, preferably from aliphatic glycols. Preferably the polyester contains only one glycol, preferably ethylene glycol. Preferably the synthetic linear polyester contains one aromatic dicarboxylic acid and one glycol. Polyethylene terephthalate (PET) or polyethylene 2,6-naphthalate (PEN), particularly PET, is the preferred polyester. The film-forming polyester resin is the major component of the substrate, and makes up at least 50% by weight of the total weight of the substrate layer, and in one embodiment at least 65%, typically at least 80%, more typically at least 90%, more typically at least 95%, and in one embodiment at least 99% by weight of the total weight of the substrate layer.

Formation of the polyester is conveniently effected in a known manner by condensation or ester interchange, generally at temperatures up to about 295° C. Optionally, solid state polymerisation may be used to increase the intrinsic viscosity to a desired value, using conventional techniques well-known in the art, for instance using a fluidised bed such as a nitrogen fluidised bed or a vacuum fluidised bed using a rotary vacuum drier.

The UV absorbers present in the substrate may be selected from any suitable UV-absorber, and typically from organic UV-absorbers. The UV-absorber in the substrate has an extinction coefficient much higher than that of the polyester such that most of the incident UV light is absorbed by the UV absorber rather than by the polyester. The UV absorber generally dissipates the absorbed energy as heat, thereby avoiding degradation of the polymer chain, and improving the stability of the polyester to UV light. Suitable examples of organic UV absorbers include those disclosed in Encyclopaedia of Chemical Technology, Kirk-Othmer, Third Edition, John Wiley & Sons, Volume 23, Pages 615 to 627. Particular examples of UV absorbers include benzophenones, benzotriazoles (U.S. Pat. Nos. 4,684,679, 4,812,498 and 4,681,905), benzoxazinones (U.S. Pat. Nos. 4,446,262, 5,251,064 and 5,264,539) and triazines (U.S. Pat. Nos. 3,244,708, 3,843,371, 4,619,956, 5,288,778 and WO 94/05645). In one embodiment of the invention, the UV absorber may be chemically incorporated in the polyester chain. Such UV-stable polyesters may be produced by incorporating a benzophenone into the polyester, for example as described in EP-A-0006686, EP-A-0031202, EP-A-0031203 and EP-A-0076582. The specific teaching of the aforementioned documents regarding UV-absorbers is incorporated herein by reference. In a particularly preferred embodiment, improved UV-stability in the present invention is provided by triazines, more preferably hydroxyphenyltriazines, and particularly hydroxyphenyltriazine compounds of formula (II):

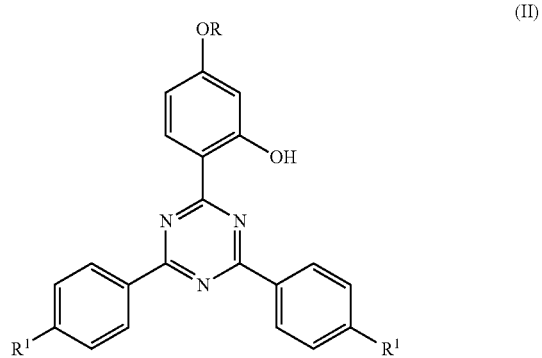

wherein R is hydrogen, $C_1$-$C_{18}$ alkyl, $C_2$-$C_6$ alkyl substituted by halogen or by $C_1$-$C_{12}$ alkoxy, or is benzyl and $R^1$ is hydrogen or methyl. R is preferably $C_1$-$C_{12}$ alkyl or benzyl, more preferably $C_3$-$C_6$ alkyl, and particularly hexyl. $R^1$ is preferably hydrogen. An especially preferred UV absorber is 2-(4,6-diphenyl-1,3,5-triazin-2-yl)-5-(hexyl)oxy-phenol, which is commercially available as Tinuvin™ 1577 FF from Ciba-Additives.

The amount of UV absorber is in the range from 0.1% to 10%, more preferably 0.2% to 5%, and particularly 0.5% to 2% by weight, relative to the total weight of the substrate layer.

Preferably, the intrinsic viscosity of the polyester film substrate is at least 0.55, preferably at least 0.60, preferably at least 0.65 and preferably at least 0.70.

The substrate may further comprise any of the additives conventionally employed in the manufacture of polyester films. Thus, agents such as: cross-linking agents; dyes; pigments; voiding agents; lubricants; anti-oxidants; radical scavengers; thermal stabilisers; end-capping agents; flame retardants and inhibitors; anti-blocking agents; surface active agents; slip aids; gloss improvers; prodegradents; viscosity modifiers; and dispersion stabilisers may be incorporated as appropriate.

The substrate optionally comprises a compound capable of absorbing a specific wavelength band of incident radiation and emitting the energy therefrom as light having a lower wavelength than the absorbed light, typically wherein the compound absorbs UV-radiation and emits, or "down-converts", that energy as light in the visible region which can then be used to generate electrical current in the PV cell. Such compounds are known in the art, and are hereinafter referred to as "down-convertors". Optical brighteners and fluorescent brightening (or whitening) agents (FBAs) are a known class of down-convertor, which are typically organic dyes that absorb UV light (typically 340-370 nm), and re-emit light in the blue region (typically 420-470 nm), causing a perceived "whitening" effect, making materials look less yellow by increasing the overall amount of blue light reflected. Known optical-brighteners include triazine-stilbenes (di-, tetra- or hexa-sulfonated); coumarins; imidazolines; diazoles; triazoles; benzoxazolines; and biphenyl-stilbenes. US-2006/0169971-A discloses "quantum dots" having an average particle diameter of 0.1 to 10 nm comprising down-converting inorganic compounds selected from those containing (a) a first element selected from Group 2, 12, 13 or 14 of the Periodic Table of Elements and a second element selected from Group 16; (b) a first element selected from Group 13 and a second element selected from Group 15; and (c) an element selected from Group 14. Specific examples include MgO, MgS, MgSe, MgTe, CaO, CaS, CaSe, CaTe, SrO, SrS, SrSe, SrTe, BaO, BaS, BaSe, BaTe, ZnO, ZnS, ZnSe, ZnTe, CdO, CdS, CdSe, CdTe, HgO, HgS, HgSe, HgTe, $Al_2O_3$, $Al_2S_3$, $Al_2Se_3$, $Al_2Te_3$, $Ga_2O_3$, $Ga_2S_3$, $Ga_2Se_3$, $Ga_2Te_3$, $In_2O_3$, $In_2S_3$, $In_2Se_3$, $In_2Te_3$, $SiO_2$, $GeO_2$, $SnO_2$, SnS, SnSe, SnTe, PbO, $PbO_2$, PbS, PbSe, PbTe, AlN, AlP, AlAs, AlSb, GaN, GaP, GaAs, GaSb, InN, InP, InAs, InSb, BP, Si and Ge. The amount of down-convertor in the substrate may be in the range of from about 0.1 to about 10% by weight relative to the total weight of the substrate, preferably from about 0.2 to about 5%, and more preferably about 0.5 to about 2%.

The substrate optionally comprises a light-stabiliser, preferably a hindered amine light stabilizer (HALS), typically having a hindered piperidine skeleton in the molecule. Specific examples of hindered amine light stabilizers include bis-(2,2,6,6-tetramethyl-4-piperidyl)sebacate, bis-(N-methyl-2,2,6,6-tetramethyl-4-piperidyl)sebacate, bis-(1,2,2,6,6-pentamethyl-4-piperidyl)sebacate, 1,2,2,6,6-pentamethyl-4-piperidyl-tridecyl-1,2,3,4-butanetetracarboxylate, tetrakis-(2,2,6,6-tetramethyl-4-piperidyl)-1,2,3,4-butanetetracarboxylate, and tetrakis-(N-methyl-2,2,6,6-tetramethyl-4-piperidyl)-1,2,3,4-butanetetracarboxylate. Of these hindered amines, N-methyl hindered amines are preferable. The total amount of hindered amine light stabilizer in a layer is preferably in the range of from about 0.1 to about 10% by weight, relative to the total weight of the layer, preferably 0.2 to about 5%, and more preferably about 0.5 to about 2%.

The components of the composition of a layer may be mixed together in a conventional manner. For example, by mixing with the monomeric reactants from which the film-forming polymer is derived, or the components may be mixed with the polymer by tumble or dry blending or by compounding in an extruder, followed by cooling and, usually, comminution into granules or chips. Masterbatching technology may also be employed.

The polymeric coating layer comprises an ethylene acrylic acid (EAA) copolymer, and this is suitably applied to the substrate via a coating technique, as discussed further below.

Suitable ethylene acrylic acid (EAA) copolymers typically comprise from about 2 to about 30 wt % acrylic acid co-monomer. In one embodiment, the EAA copolymer comprises only ethylene and acrylic acid co-monomers. However, the copolymers may further comprise one or more additional co-monomers. Such additional co-monomers include, for instance, alkyl acrylates, preferably wherein the alkyl group is a $C_{1-10}$ alkyl group, such as methyl, ethyl, n-propyl, isopropyl, n-butyl, isobutyl, t-butyl, hexyl, 2-ethylhexyl, heptyl and n-octyl, and particularly methyl. Such additional co-monomers also include alkyl methacrylates (for instance methyl methacrylate). Any additional co-monomer may be present in amounts of from about 1 to about 30 wt %. Where an additional co-monomer is present, the combined amounts of the acrylic acid and the additional co-monomer(s) is typically no more than 50%, and typically no more than 30 wt %. Other additional co-monomers include acrylonitrile; methacrylonitrile; halo-substituted acrylonitrile; halo-substituted methacrylonitrile; acrylamide; methacrylamide; N-methylol acrylamide; N-ethanol acrylamide; N-propanol acrylamide; N-methacrylamide; N-ethanol methacrylamide; N-methylacrylamide; N-tertiary butyl acrylamide; hydroxyethyl methacrylate; glycidyl acrylate; glycidyl methacrylate; dimethylamino ethyl methacrylate; itaconic acid; itaconic anhydride; half ester of itaconic acid; vinyl esters such as vinyl acetate, vinyl chloracetate, vinyl benzoate, vinyl pyridine and vinyl chloride; vinylidene chloride; maleic acid; maleic anhydride; and styrene and derivatives of styrene such as chlorostyrene, hydroxystyrene and alkylated styrenes wherein the alkyl group is a $C_{1-10}$ alkyl group. Suitable EAA copolymers for use in the present invention may be selected from Michem® Prime copolymers (available from Michelman, Cincinnati, US), such as the Michem® Prime 4983-RE grade. Preferably, the molecular weight of the EAA co-polymer is from about 5,000 to about 20,000, preferably from about 5,000 to about 10,000.

Optionally, the polymeric coating layer further comprises a UV absorber and/or down-convertor and/or light-stabiliser, preferably independently selected from the compounds discussed hereinabove for the substrate.

The thickness of the polymeric coating layer is an important parameter. The or each polymeric coating layer has a thickness in the range of from about 10 nm to about 200 nm, preferably at least 25 nm, and typically at least 80 nm, and typically no more than about 160 nm. The precise thickness of the polymeric layer may be adjusted in order to increase the total light transmittance of the composite film.

Formation of the substrate may be effected by conventional extrusion techniques well-known in the art. In general terms the process comprises the steps of extruding a layer of molten polymer, quenching the extrudate and orienting the quenched extrudate in at least one direction. The substrate may be uniaxially-oriented, but is preferably biaxially-oriented. Orientation may be effected by any process known in the art for producing an oriented film, for example a tubular or flat film process. Biaxial orientation is effected by drawing in two mutually perpendicular directions in the plane of the film to achieve a satisfactory combination of mechanical and physical properties. In a tubular process, simultaneous biaxial orientation may be effected by extruding a thermoplastics polyester tube which is subsequently quenched, reheated and then expanded by internal gas pressure to induce transverse orientation, and withdrawn at a rate which will induce longitudinal orientation. In the preferred flat film process, the film-forming polyester is extruded through a slot die and rapidly quenched upon a chilled casting drum to ensure that the polyester is quenched to the amorphous state. Orientation is then effected by stretching the quenched extrudate in at least one direction at a temperature above the glass transition temperature of the polyester. Sequential orientation may be effected by stretching a flat, quenched extrudate firstly in one direction, usually the longitudinal direction, i.e. the forward direction through the film stretching machine, and then in the transverse direction. Forward stretching of the extrudate is conveniently effected over a set of rotating rolls or between two pairs of nip rolls, transverse stretching then being effected in a stenter apparatus. Stretching is generally effected so that the dimension of the oriented film is from 2 to 5, more preferably 2.5 to 4.5 times its original dimension in the or each direction of stretching. Typically, stretching is effected at temperatures higher than the $T_g$ of the polyester, preferably about 15° C. higher than the $T_g$. Greater draw ratios (for example, up to about 8 times) may be used if orientation in only one direction is required. It is not necessary to stretch equally in the machine and transverse directions although this is preferred if balanced properties are desired.

The stretched film is dimensionally stabilised by heat-setting under dimensional support at a temperature above the glass transition temperature of the polyester but below the melting temperature thereof, to induce the desired crystallisation of the polyester. During the heat-setting, a small amount of dimensional relaxation may be performed in the transverse direction, TD by a procedure known as "toe-in". Toe-in can involve dimensional shrinkage of the order 2 to 4% but an analogous dimensional relaxation in the process or machine direction, MD is difficult to achieve since low line tensions are required and film control and winding becomes problematic. The actual heat-set temperature and time will vary depending on the composition of the film and its desired final thermal shrinkage but should not be selected so as to substantially degrade the toughness properties of the film such as tear resistance. Within these constraints, a heat set temperature of about 180° to 245° C. is generally desirable. After heat-setting the film is typically quenched rapidly in order induce the desired crystallinity of the polyester.

The film is further heat-stabilized using a relaxation stage, either in-line or off-line. In this additional step, the film is heated at a temperature lower than that of the heat-setting stage, and with a much reduced MD and TD tension. The tension experienced by the film is typically less than 5 kg/m, preferably less than 3.5 kg/m, more preferably in the range of from 1 to about 2.5 kg/m, and typically in the range of 1.5 to 2 kg/m of film width. For a relaxation process which controls the film speed, the reduction in film speed (and therefore the strain relaxation) is typically in the range 0 to 2.5%, preferably 0.5 to 2.0%. There is no increase in the transverse dimension of the film during the heat-stabilisation step. The temperature to be used for the heat-stabilisation step can vary depending on the desired combination of properties from the final film, with a higher temperature giving better, i.e. lower, residual shrinkage properties. A temperature of 135 to 250° C. is generally desirable, preferably 150 to 230° C., more preferably 170 to 200° C. The duration of heating will depend on the temperature used but is typically in the range of 10 to 40 seconds, with a duration of 20 to 30 seconds being preferred. This heat-stabilisation process can be carried out by a variety of methods, including flat and vertical configurations and either "off-line" as a separate process step or "in-line" as a continuation of the film manufacturing process. Film thus processed will exhibit a smaller thermal shrinkage than that produced in the absence of such post heat-setting relaxation.

Formation of the composite film is effected by coating the polymeric coating layer onto one or both surfaces of the substrate. Coating may be effected using any suitable coating technique, including gravure roll coating, reverse roll coating, dip coating, bead coating, extrusion-coating, melt-coating or electrostatic spray coating, preferably wherein the coating step avoids the use of organic solvent. An "off-line" coating method may be used, in which coating of the substrate is conducted after the manufacture of the substrate has been completed. Preferably, however, coating of the polymeric coating layer is conducted "in-line", i.e. wherein the coating step takes place during film manufacture and before, during or between any stretching operation(s) employed in order to improve the efficiency and economy of the manufacturing process.

Prior to application of a coating layer onto the substrate, the exposed surface of the substrate may, if desired, be subjected to a chemical or physical surface-modifying treatment to improve the bond between that surface and the subsequently applied layer. For example, the exposed surface of the substrate may be subjected to a high voltage electrical stress accompanied by corona discharge. Alternatively, the substrate may be pretreated with an agent known in the art to have a solvent or swelling action on the substrate, such as a halogenated phenol dissolved in a common organic solvent e.g. a solution of p-chloro-m-cresol, 2,4-dichlorophenol, 2,4,5- or 2,4,6-trichlorophenol or 4-chlororesorcinol in acetone or methanol.

The overall thickness of the composite film is typically in the range of from 5 to 350 µm, preferably no more than about 250 µm, and in one embodiment no more than about 100 µm, and in a further embodiment no more than about 50 µm, and typically at least 12 µm, more typically at least about 20 µm. The thickness of the substrate is preferably between about 50% and 99% of the composite film.

The composite film is typically optically clear or transparent, which is used herein to mean preferably having a % of scattered visible light (haze) of no more than 15%, preferably no more than 10%, preferably no more than 6%, more preferably no more than 3.5% and particularly no more than 1.5%, and/or a total luminous transmission (TLT) for light in the visible region (400 nm to 700 nm) of preferably at least 85%, preferably at least 90%, more preferably at least about 92%, more preferably at least about 95%.

The composite film discussed hereinabove may be advantageously used in the manufacture of electronic or opto-electronic devices, such as electroluminescent (EL) display devices (particularly organic light emitting display (OLED) devices), electrophoretic displays (e-paper), photovoltaic (PV) cells and semiconductor devices (such as organic field effect transistors, thin film transistors and integrated circuits generally), particularly flexible such devices.

The composite film discussed hereinabove is of particular advantage in the manufacture a PV cell further comprising a photovoltaic-active layer, particularly a thin-film PV cell including those wherein the photovoltaic material is selected from amorphous silicon (a-Si) and other thin-film silicon (TF-Si) including proto-crystalline, nano-crystalline (nc-Si or nc-Si:H) and black silicon; cadmium-telluride (CdTe); copper-indium-gallium-(di)selenide (CIGS); dye-sensitized photo-voltaic cells; organic photovoltaic cells which utilise conductive organic compounds. In particular, the composite film discussed hereinabove is used in the manufacture of a CIGS PV cell as described herein.

Thus, according to the present invention there is further provided a PV cell, particularly a thin-film PV cell as described immediately hereinabove, and particularly a CIGS PV cell comprising a transparent composite film of the present invention. The PV cell comprises a layer of photoactive material disposed between a supporting substrate and the transparent composite film of the present invention, and this multilayer assembly is encapsulated with an optically clear material having barrier properties to provide high resistance to gas and solvent permeation, as described herein.

According to a further aspect of the present invention there is provided a CIGS PV cell comprising a thin crystalline layer of photo-active CIGS material disposed between a supporting substrate (typically steel or molybdenum-coated glass, and preferably steel) and the transparent composite film of the present invention, and this multilayer assembly is encapsulated with an optically clear material having barrier properties to provide resistance to gas and solvent permeation. The encapsulating barrier material is typically a self-supporting film or sheet, which is then applied to the multilayer composite using thermal lamination techniques, typically under vacuum, as is known in the art. The encapsulated multilayer assembly is disposed between a front-plane and a back-plane, such that the transparent composite film of the present invention is disposed between the photo-active layer and the front-plane. The front-plane and/or back-plane is/are typically glass but may also be a polymeric material.

The encapsulating barrier material is preferably an ionomer-based material, i.e. a polymer made up primarily of non-polar repeat units with a minor proportion (typically no more than about 15 wt %) of salt-containing units. Preferred ionomers are selected from thermoplastic carboxylate ionomers wherein the non-polar comonomers are typically selected from ethylene and styrene (preferably ethylene), and containing a minor proportion of salt-containing units such as metal salts (for instance, alkali metal or zinc salts) of methacrylic acid and/or acrylic acid. Preferred ionomers for the encapsulant are the copolymers of ethylene and methacrylic acid and/or acrylic acid partially or completely neutralised with alkali metals or zinc, for instance Surlyn® (DuPont; for instance grade 1702).

Other suitable encapsulant materials include ethylene vinyl acetate (EVA) copolymer resins, commercially available for instance as Elvax® resins (DuPont, for instance grades PV 1410 to PV1650Z), typically wherein the vinyl acetate component is in the range of from about 28 to about 33 wt %.

Other suitable encapsulant materials are selected from polyvinylbutyral resins, also commercially available from DuPont (for instance the PV5200 series), and from silicone resins (for instance, Dow Corning's PV-6100 series of optically clear silicone encapsulants).

The adhesion strength between the encapsulant material and the coated surface of the composite film described herein is such that the linear average load is preferably at least 3 lb/in, preferably at least 7 lb/in, preferably at least 10 lb/in, preferably at least 15 lb/in, preferably at least 20 lb/in, measured as described herein.

According to the present invention, there is provided a multilayer assembly comprising the composite film described herein and further comprising an encapsulant layer disposed directly on a coated surface of the composite film, preferably wherein said encapsulant layer is laminated to said coated surface of the composite film, preferably wherein the adhesion strength between said encapsulant layer and said composite film is such that the linear average load is preferably at least 3 lb/in, preferably at least 7 lb/in, preferably at least 10 lb/in, preferably at least 15 lb/in, and preferably at least 20 lb/in, measured as described herein.

Property Measurement

The following analyses were used to characterize the films described herein:

(i) Clarity was evaluated by measuring total luminance transmission (TLT) and haze (% of scattered transmitted visible light) through the total thickness of the film using an M57D spherical hazemeter (Diffusion Systems) according to the standard test method ASTM D1003.

(ii) Intrinsic viscosity (in units of dL/g) was measured by solution viscometry in accordance with ASTM D5225-98 (2003) on a Viscotek™ Y-501C Relative Viscometer (see, for instance, Hitchcock, Hammons & Yau in *American Laboratory* (August 1994) "The dual-capillary method for modern-day viscometry") by using a 0.5% by weight solution of polyester in o-chlorophenol at 25° C. and using the Billmeyer single-point method to calculate intrinsic viscosity:

$$\eta = 0.25\eta_{red} + 0.75(\ln \zeta_{rel})/c$$

wherein:
$\eta$=the intrinsic viscosity (in dL/g),
$\eta_{rel}$=the relative viscosity,
c=the concentration (in g/dL), &
$\eta_{red}$=reduced viscosity (in dL/g), which is equivalent to $(\eta_{rel}-1)/c$ (also expressed as $\eta_{sp}/c$ where $\eta_{sp}$ is the specific viscosity).

(iii) Thermal shrinkage was assessed for film samples of dimensions 200 mm×10 mm which were cut in specific directions relative to the machine dimension (MD) and transverse dimension (TD) of the film and marked for visual measurement. The longer dimension of the sample (i.e. the 200 mm dimension) corresponds to the film direction for which shrinkage is being tested, i.e. for the assessment of shrinkage in the machine direction, the 200 mm dimension of the test sample is oriented along the machine direction of the film. After heating the specimen to the predetermined temperature (herein 150° C.) by placing in a heated oven at that temperature and holding for an interval of 30 minutes, it was cooled to room temperature and its dimensions re-measured manually. The thermal shrinkage was calculated and expressed as a percentage of the original length.

(iv) Weatherability may be measured in an atmosphere of 100% relative humidity (RH) at 121° C., in an atmosphere of 85% RH at 85° C., and in a weatherometer (Atlas Ci65 Weather-o-meter) running to ISO-4892-2. The film is aged in the weatherometer under the following conditions: automatic irradiance of 0.50 Wm$^2$ at 340 nm; black panel temperature=63° C. (theoretical maximum temperature); wet bulb depression=10° C.; conditioning water=30° C.; weathering cycle=102 minutes light/18 minutes water; time of test=up to 10,000 hours. Film properties are measured at various times in the test.

(v) Yellowness Index before and after weathering was tested according to ASTM E313.

(vi) Adhesion strength of the composite film to an encapsulant barrier layer (8 mil (approx. 203 μm) EVA layer, post curing, with a three-ply PE/PET/PE back sheet for stability) is assessed using the peel method of ASTM D903.

Adhesion strength may be expressed either as the linear peak load or linear average load.

The invention is further illustrated by the following examples. The examples are not intended to limit the invention as described above. Modification of detail may be made without departing from the scope of the invention.

EXAMPLES

Example 1

A polymer composition comprising polyethylene terephthalate comprising a UV absorber (Tinuvin™ 1577FF; 1% by weight of the composition) was melt extruded, cast onto a cooled rotating drum and stretched in the direction of extrusion to approximately 3 times its original dimensions at a temperature of 150° C. The film was then coated on both sides with an EAA coating composition comprising:
1. Michem® Prime 4983-RE (25% solids) (32%)
2. Surfynol® 420 (100%) (0.3%)
3. Cymel® 350 (20% solution) (7%)
4. Ammonium para-toluene sulfonate (APTSA; 10% solution) (0.4%)
5. DMAE (100%) (as required to control pH to 8.5-9.5 range)
6. Demineralized water (60.3%), sufficient to provide a dry coating thickness of 90 nm on each side. The coated film was then passed into a stenter oven at a temperature of 120° C. where the film was dried and stretched in the sideways direction to approximately 3 times its original dimensions. The biaxially stretched film was heat set at a temperature of about 200° C. The heat-set biaxially stretched film was then unwound and then further heat-stabilised in a roll-to-roll process by passing the film through an additional set of ovens, of which the maximum temperature was above 150° C., for a duration of more than 2 seconds. The film was transported through the ovens under a low line tension, allowing it to relax and stabilize further. The final composite film thickness was 50 µm, in which the final dry thickness of the coating was 90 nm on each side. The shrinkage of the composite film at 150° C. for 30 minutes was equal or less than 0.1% in both the longitudinal and transverse dimensions of the film. The TLT of the composite film was greater than 92%. The Yellowness Index of the film was just under 8 before weathering, which increased only to just under 12 after accelerated ageing (weathering) for 8000 hours as described herein.

Example 2

The procedure of example 1 was repeated except that no Tinuvin™ UV absorber was added to the PET film.

Example 3

The procedure of example 1 was repeated except that: (i) the coating layer was applied to only one side of the film; and (ii) the coat weight was reduced to give a dry coat weight of 30 nm. The inventors observed that the lower coat-weight had little effect on adhesion (as measured by the linear average load), as is evident from the data in Table 1 below.

Example 4

The procedure of example 1 was repeated except that: (i) no Tinuvin™ absorber was added to the PET film; (ii) no off-line heat stabilization was conducted; (iii) the coat weight applied was reduced to give a dry coat weight of 30 nm on each side; and (iv) the coating composition was an acrylic formulation comprising:
1. Centrifuged Rhoplex-3208 latex at 13% solids (26.4%)
2. Diluted Renex 690 (20% solution). (0.7%)
3. DMAE (Dimethylaminoethanol) (0.1%)
4. APTSA solution (10% solution of ammonium para toluene sulfonate). (3.5%)
5. Demineralized wate r.(69.225%)
6. S yton HT-50.(0.075%)

The performance of the Examples was tested as described herein and the results shown in the tables below. In addition, the composite film of Example 1 was used in the manufacture of a CIGS PV cell having the structure as described herein and exhibited excellent performance in the aspects described hereinabove, and was superior to the comparative film of Example 4 (acrylic coating).

TABLE 1

| Sample | TLT (%) | Change in Yellowness Index on weathering | Adhesion linear peak load (lb/in) | Adhesion Linear average load (lb/in) | Shrinkage (%) TD | Shrinkage (%) MD |
|---|---|---|---|---|---|---|
| Ex. 1 | 95.5 | 4 unit increase after 8000 hrs | 27.85 | 21.29 | 0.02 | 0.1 |
| Ex. 2 | 95.5 | — | — | — | — | — |
| Ex. 3 | 92.6 | — | 36.83 | 19.37 | — | — |
| Ex. 4 | 91.0 | Film failure after 800 hrs | 3.21 | 1.66 | 1.0 | 1.0 |

The invention claimed is:

1. A composite film comprising:
(i) a heat-set and heat-stabilised oriented polyester substrate comprising a UV-absorber in an amount of from about 0.1 to about 10% based on the total weight of the polyester substrate, and
(ii) on one or both surfaces of the substrate a polymeric coating layer, which has a thickness in the range of from about 10 nm to about 200 nm, and which comprises an ethylene acrylic acid (EAA) copolymer,
wherein the composite film exhibits a shrinkage at 150° C. for 30 minutes of less than 0.1% in both the longitudinal and transverse dimensions of the film.

2. The composite film according to claim 1 wherein the polyester substrate is biaxially oriented.

3. The composite film according to claim 1 wherein the polyester is selected from polyethylene terephthalate (PET) or polyethylene 2,6-naphthalate (PEN).

4. The composite film according to claim 1 wherein the UV absorber is a hydroxyphenyltriazine.

5. The composite film according to claim 1 wherein the intrinsic viscosity of the polyester film substrate is at least 0.65.

6. The composite film according to claim 1 wherein the substrate further comprises a hindered amine light stabilizer (HALS) in the range from about 0.1 to about 10% by weight, relative to the total weight of the layer.

7. The composite film according to claim 1 wherein the ethylene acrylic acid (EAA) copolymer comprises from about 2 to about 30 wt % acrylic acid co-monomer.

8. The composite film according to claim 1 wherein the polymeric coating layer is disposed on the substrate using an in-line coating technique.

9. The composite film according to claim 1 wherein the overall thickness of the composite film is in the range of from about 12 to about 350 μm.

10. The composite film according to claim 1 wherein the composite film is transparent and exhibits a haze of no more than 15%.

11. An electronic or opto-electronic device comprising a composite film as defined in claim 1.

12. The electronic or opto-electronic device according to claim 11 wherein said electronic or opto-electronic device is selected from electroluminescent display devices, electrophoretic displays, photovoltaic cells and semiconductor devices.

13. The electronic or opto-electronic device according to claim 11 wherein said device is a photovoltaic cell further comprising a photovoltaic-active layer.

14. The electronic or opto-electronic device according to claim 13 wherein said photovoltaic cell comprises a multilayer assembly comprising a photovoltaic-active layer disposed between a supporting substrate and said composite film, wherein the multilayer assembly is encapsulated within an optically clear encapsulating barrier material.

15. The electronic or opto-electronic device according to claim 13 wherein the device is a GIGS photovoltaic cell.

16. The electronic or opto-electronic device according to claim 15 wherein said GIGS photovoltaic cell comprises a multilayer assembly comprising a crystalline layer of photoactive GIGS material disposed between a supporting substrate and said composite film, wherein the multilayer assembly is encapsulated with an optically clear encapsulating barrier material.

17. The electronic or opto-electronic device according to claim 14 wherein said encapsulating barrier material is an ionomeric polymer comprising non-polar repeat units and further comprising no more than about 15 wt % of salt-containing units.

18. The electronic or opto-electronic device according to claim 17 wherein said encapsulating barrier material is a thermoplastic carboxylate ionomer wherein the non-polar repeat units are selected from ethylene and styrene, and said salt-containing units are selected from metal salts of methacrylic acid and/or acrylic acid.

19. The electronic or opto-electronic device according to claim 14 wherein said encapsulating barrier material is selected from ethylene vinyl acetate copolymer resins, polyvinylbutyral resins and silicone resins.

20. The electronic or opto-electronic device according to claim 14 wherein said encapsulated multilayer assembly is disposed between a front-plane and a back-plane, such that said composite film is disposed between the photo-active layer and the front-plane.

21. The composite film according to claim 1 wherein the composite film is transparent and wherein the total luminous transmission for light in the visible region is at least 85%.

* * * * *

UNITED STATES PATENT AND TRADEMARK OFFICE
CERTIFICATE OF CORRECTION

PATENT NO. : 8,941,003 B2  
APPLICATION NO. : 13/577152  
DATED : January 27, 2015  
INVENTOR(S) : Mandokoro et al.

Page 1 of 1

It is certified that error appears in the above-identified patent and that said Letters Patent is hereby corrected as shown below:

In the Claims

Column 13, line 24, Claim 15, "claim 13 wherein the device is a GIGS photovoltaic cell." should read --claim 13 wherein the device is a CIGS photovoltaic cell.--

Column 13, line 26, Claim 16, "claim 15 wherein said GIGS photovoltaic cell comprises a" should read --claim 15 wherein said CIGS photovoltaic cell comprises a--

Column 13, line 28, Claim 16, "active GIGS material disposed between a supporting sub-" should read --active CIGS material disposed between a supporting sub- --

Signed and Sealed this  
Fifth Day of May, 2015

Michelle K. Lee  
*Director of the United States Patent and Trademark Office*